(12) United States Patent
Teng

(10) Patent No.: US 7,709,184 B2
(45) Date of Patent: *May 4, 2010

(54) METHOD OF ON-PRESS DEVELOPING THERMOSENSITIVE LITHOGRAPHIC PRINTING PLATE

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 683 days.

This patent is subject to a terminal disclaimer.

(21) Appl. No.: 11/487,939

(22) Filed: Jul. 17, 2006

(65) Prior Publication Data

US 2006/0251993 A1 Nov. 9, 2006

Related U.S. Application Data

(63) Continuation-in-part of application No. 11/356,911, filed on Feb. 18, 2006, now Pat. No. 7,358,034, and a continuation-in-part of application No. 11/057,663, filed on Feb. 14, 2005, now Pat. No. 7,427,465.

(51) Int. Cl.
G03F 7/00 (2006.01)
G03C 5/18 (2006.01)
B41N 1/00 (2006.01)

(52) U.S. Cl. .............. 430/302; 430/273.1; 430/309; 430/434; 430/494; 101/453

(58) Field of Classification Search .......... 430/18, 430/270.1, 300, 302, 435; 101/181, 467
See application file for complete search history.

(56) References Cited

U.S. PATENT DOCUMENTS

| | | | |
|---|---|---|---|
| 4,329,026 A * | 5/1982 | Moyroud | 396/555 |
| 5,186,103 A * | 2/1993 | Gelinas et al. | 101/181 |
| 5,258,263 A | 11/1993 | Cheema et al. | 430/309 |
| 5,379,698 A | 1/1995 | Nowak et al. | 101/454 |
| 5,491,046 A | 2/1996 | DeBoer et al. | 430/302 |
| 5,616,449 A | 4/1997 | Cheng et al. | 430/302 |
| 5,674,658 A | 10/1997 | Burbery et al. | 430/262 |
| 5,677,110 A | 10/1997 | Chia et al. | 430/302 |
| 5,705,309 A | 1/1998 | West et al. | 430/167 |
| 5,815,243 A * | 9/1998 | Bailey et al. | 355/27 |
| 5,955,238 A | 9/1999 | Yokoya et al. | 430/166 |
| 6,117,610 A | 9/2000 | Sheriff et al. | 430/190 |
| 6,153,356 A | 11/2000 | Urano et al. | 430/281.1 |
| 6,232,038 B1 | 5/2001 | Takasaki et al. | 430/281.1 |
| 6,482,571 B1 * | 11/2002 | Teng | 430/302 |
| 6,548,222 B2 | 4/2003 | Teng | 430/278.1 |
| 6,632,580 B2 | 10/2003 | Maemoto | 430/138 |
| 2004/0023136 A1 * | 2/2004 | Munnelly et al. | 430/18 |
| 2004/0179922 A1 * | 9/2004 | Blake et al. | 414/411 |
| 2005/0266349 A1 * | 12/2005 | Van Damme et al. | 430/300 |
| 2006/0019193 A1 * | 1/2006 | Roberts et al. | 430/270.1 |
| 2006/0183049 A1 * | 8/2006 | Teng | 430/270.1 |
| 2007/0095232 A1 * | 5/2007 | Teng | 101/467 |
| 2007/0101886 A1 * | 5/2007 | Teng | 101/450.1 |
| 2007/0289468 A1 * | 12/2007 | Teng | 101/467 |

* cited by examiner

*Primary Examiner*—Cynthia H Kelly
*Assistant Examiner*—Chanceity N Robinson

(57) ABSTRACT

A method of on-press developing a thermosensitive lithographic printing plate with ink and/or fountain solution is described. The lithographic plate comprises on a substrate a thermosensitive layer soluble or dispersible in ink and/or fountain solution and capable of hardening upon exposure to an infrared radiation. The printing plate can be a pre-coated plate in the form of sheet or web, or can be prepared on press by coating a thermosensitive layer onto a substrate that is a sheet material or a seamless sleeve mounted on a plate cylinder or is the surface of a plate cylinder of the lithographic press.

9 Claims, No Drawings

METHOD OF ON-PRESS DEVELOPING THERMOSENSITIVE LITHOGRAPHIC PRINTING PLATE

RELATED PATENT APPLICATIONS

This application is a continuation-in-part application of U.S. patent application Ser. No. 11/356,911 filed Feb. 18, 2006; and U.S. patent application Ser. No. 11/057,663 filed Feb. 14, 2005.

FIELD OF THE INVENTION

This invention relates to lithographic printing. More particularly, it relates to lithographic printing plate having on a substrate a thermosensitive layer capable of hardening upon exposure to an infrared laser and on-press developable with ink and/or fountain solution.

BACKGROUND OF THE INVENTION

Lithographic printing plate (after process) generally consists of ink-receptive areas (image areas) and ink-repelling areas (non-image areas); the image areas and the non-image areas are substantially on the same plane. During printing operation, ink is preferentially received in the image areas, not in the non-image areas, and then transferred, usually through a printing blanket, to the surface of a material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. Here, hardening means becoming insoluble in a certain developer. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened areas.

On-press developable lithographic printing plates have been disclosed in the literature. Such plates can be directly mounted on press after exposure to develop with ink and/or fountain solution during the initial press operation and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,242,156.

Conventionally, the plate is exposed with an actinic light (usually an ultraviolet light from a lamp) through a separate photomask film having predetermined image pattern that is placed between the light source and the plate. While capable of providing plate with superior lithographic quality, such a method is cumbersome and labor intensive.

Laser sources have been increasingly used to imagewise expose a printing plate that is sensitized to a corresponding laser wavelength. This allows the elimination of the photomask film, reducing material, equipment and labor cost.

Among the laser imagable plates, infrared laser sensitive plates (also called thermosensitive plates or thermal plates) are the most attractive because they can be handled and processed under white light, at least for limited time. Various thermosensitive plates have been disclosed in the patent literature. Examples of thermosensitive plates are described in U.S. Pat. Nos. 4,054,094 and 5,379,698 (laser ablation plates), U.S. Pat. Nos. 5,705,309, 5,674,658, 5,677,106, 6,153,356, 6,232,038, and 4,997,745 (negative thermosensitive plates), U.S. Pat. Nos. 5,491,046 and 6,117,610 (both positive and negative thermosensitive plates, depending on the process), and U.S. Pat. Nos. 5,919,600 and 5,955,238 (thermosensitive positive waterless plate).

Despite the progress in conventional on-press developable plates and digital laser imagable plates, there is a desire for a on-press developable thermosensitive lithographic printing plate and method which utilize infrared laser or other infrared radiation, do not produce ablation debris, do not require a separate liquid development process, and are easy to use.

SUMMARY OF THE INVENTION

According to the present invention, there has been provided a negative lithographic printing plate capable of on-press development with ink and/or fountain solution, comprising on a substrate a thermosensitive layer capable of hardening upon exposure to an infrared radiation and on-press developable with ink and/or fountain solution; wherein said thermosensitive layer exhibits an affinity or aversion substantially opposite to the affinity or aversion of said substrate to at least one printing liquid selected from the group consisting of ink and an abhesive fluid for ink.

According to another aspect of this invention, there has been provided a method of on-press development, on-press imaging and development, or on-press coating, imaging and development of the above lithographic printing plate, wherein the printing plate is imagewise exposed with an infrared radiation, and then developed on press by contacting with ink and/or fountain solution to remove the non-hardened areas of the thermosensitive layer during the initial printing operation.

In addition to regular lithographic printing plate which is a sheet material pre-coated with a thermosensitive layer, the printing plate can be prepared on press by coating a thermosensitive layer onto a substrate that is a sheet material or a seamless sleeve mounted on a plate cylinder or is the surface of a plate cylinder of the lithographic press. The pre-coated lithographic plate can be supplied in the form of sheets (usually with many sheets stacked in a package during storage) or in the form of continuous web in a roll; a portion of the continuous web in a roll can be cut into a sheet right before imaging and on-press development, or can be directly mounted on the plate cylinder of the press with the roll being installed within the plate cylinder. The pre-coated plate can be exposed with an infrared radiation off press or on press before on-press development with ink and/or fountain solution. The on-press coated lithographic plate is imagewise exposed with an infrared radiation on the lithographic press and then on-press developed with ink and/or fountain solution. The on-press developed printing plate directly prints images to the receiving sheets. Infrared laser is a preferred infrared radiation.

DETAILED DESCRIPTION OF THE PREFERRED EMBODIMENTS

The substrate employed in the lithographic plates of this invention can be any lithographic support. Such a substrate may be a metal sheet, a polymer film, a coated paper, a seamless sleeve, or a cylinder. Aluminum (including aluminum alloys) sheet is a preferred metal support. Particularly preferred is an aluminum support that has been grained and anodized, optionally further deposited with a barrier layer. Polyester film is a preferred polymeric film support. A surface coating may be coated to achieve desired surface properties. For wet plate, the substrate should have a hydrophilic or oleophilic surface, depending on the surface properties of the thermosensitive layer; commonly, a wet lithographic plate has a hydrophilic substrate and an oleophilic thermosensitive layer. For waterless plate, the substrate should have an oleophilic or oleophobic surface, depending on the surface properties of the thermosensitive layer.

Particularly preferred hydrophilic substrate for a wet lithographic plate is an aluminum support that has been grained and anodized; or grained, anodized and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

The sheet-form substrate is usually single-sided, with one side having the desired surface property; such substrate is used to prepare single-sided plate by coating the thermosensitive layer on one side. However, double-sided sheet-form substrate can be prepared, with both sides having desired surface property; such substrate can be used to prepare double-sided plate by coating the thermosensitive layer on both sides.

In addition to sheet-form substrate that is the most common substrate type, the lithographic substrate can be seamless sleeve or cylinder having lithographically suitable external surface property.

For preparing the lithographic printing plates of the current invention, any thermosensitive layer is suitable which is capable of hardening upon exposure to an infrared radiation (about 700 to 1500 nm in wavelength), and is soluble or dispersible in and on-press developable with ink and/or fountain solution. In this application, hardening means becoming insoluble and non-dispersible in ink and/or fountain solution, and is achieved through polymerization or crosslinking of the resins (monomers, oligomers, or polymers). An infrared absorbing dye or pigment is usually used in the thermosensitive layer as sensitizer or light-to-heat converter. The thermosensitive layer preferably has a coverage of from 100 to 4000 $mg/m^2$, and more preferably from 400 to 2000 $mg/m^2$.

The hardened areas of the thermosensitive layer should exhibit an affinity or aversion substantially opposite to the affinity or aversion of the substrate to at least one printing liquid selected from the group consisting of ink and an abhesive fluid for ink. An abhesive fluid for ink is a fluid that repels ink. Fountain solution is the most commonly used abhesive fluid for ink. A wet plate consists of oleophilic image areas and hydrophilic background areas and is printed on a wet press equipped with both ink and fountain solution (or equipped with a single-fluid ink). A waterless plate consists of oleophilic image areas and oleophobic background areas and is printed on a waterless press equipped with ink.

It is noted that the thermosensitive layer can be a single layer with substantially homogeneous composition along the depth. However, the thermosensitive layer can consist of more than one sublayers having different compositions (such as different resins) or different material ratios in each layer (such as higher infrared dye amount in the inner layer than the top layer). The thermosensitive layer may also have composition gradient along the depth (such as lower infrared dye amount toward the surface and higher infrared dye amount toward the substrate). In this application, the term monomer includes both monomer and oligomer, and the term (meth) acrylate includes both acrylate and methacrylate.

Thermosensitive layer suitable for the current invention may be formulated from various thermosensitive materials containing an infrared absorbing dye or pigment. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the thermosensitive layer dispersible with ink and fountain solution, or emulsion of ink and fountain solution. Various additives useful for conventional thermosensitive layer can also be used. These additives include pigment, dye, exposure indicator, and stabilizer.

A suitable thermosensitive layer of this invention comprises a polymerizable monomer, an initiator, and an infrared absorbing dye or pigment. Preferably, the thermosensitive layer comprises a free radical or cationic polymerizable monomer, a free radical or cationic initiator, and an infrared absorbing dye. More preferably, the thermosensitive layer comprises a free radical polymerizable monomer, a free radical initiator, and an infrared absorbing dye. A polymeric binder is preferably added.

Thermosensitive materials useful in wet plates of this invention include, for example, oleophilic thermosensitive compositions comprising a polymerizable monomer, a thermosensitive initiator, and an infrared absorbing dye or pigment.

Thermosensitive oleophobic materials useful in waterless plates of this invention include, for example, oleophobic compositions comprising polymers having perfluoroalkyl or polysiloxane groups and crosslinkable terminal groups, a thermosensitive initiator, and an infrared absorbing dye or pigment.

In a preferred embodiment for wet lithographic printing plates of this invention, the thermosensitive layer comprises at least one polymerizable ethylenically unsaturated monomer having at least one terminal ethylenic group, at least one free-radical initiator capable of generating free radical in the presence of an infrared absorbing dye or pigment upon exposure to an infrared radiation, and at least one infrared absorbing dye or pigment, optionally with one or more polymeric binders. Preferred monomers are (meth)acrylate monomers, which are compounds with acrylate and/or methacrylate groups. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added.

In a second preferred embodiment for wet lithographic printing plates of this invention, the thermosensitive layer comprises at least one epoxy or vinyl ether monomer having at least one epoxy or vinyl ether functional group, at least one Bronsted acid generator capable of generating free acid in the presence of an infrared absorbing dye or pigment upon exposure to an infrared radiation, and at least one infrared absorbing dye or pigment, optionally with one or more polymeric binders. Other additives such as surfactant, dye or pigment, exposure-indicating dye (such as leuco crystal violet, azobenzene, 4-phenylazodiphenylamine, and methylene blue dyes), and acid quencher (usually an alkaline compound, such as tetrabutylammonium hydroxide or triethylamine) may be added.

In a third preferred embodiment as for wet lithographic printing plates of this invention, the thermosensitive layer contains both free radical and cationic polymerization systems. The thermosensitive layer can comprise an ethylenically unsaturated monomer, a free-radical initiator, an epoxy or vinyl ether monomer, a Bronsted acid generator, and an infrared absorbing dye or pigment, optionally with one or more polymeric binders. Various other additives may be added. The ethylenically unsaturated monomer and the epoxy or vinyl ether functional monomer can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radical and free acid in the presence of an infrared dye or pigment upon exposure to an infrared radiation.

The thermosensitive compositions as described in U.S. Pat. Nos. 6,482,571 and 6,548,222, and U.S. patent application Ser. Nos. 10/361,436, 11/057,663 and 11/356,911, the entire disclosure of which is hereby incorporated by reference, can be used for the thermosensitive layer of the instant invention.

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; and oligomeric amine (meth)acrylates. The (meth)acrylic monomers may also have other double bond or epoxide group, in addition to (meth)acrylate group. The (meth)acrylate monomers may also contain an acidic (such as carboxylic acid) or basic (such as amine) functionality. The monomers can be urethane (meth)acrylate, or non-urethane (meth)acrylate. Here a urethane (meth)acrylate monomer means any compound having at least one urethane linkage (—NHCOO—) and at least one (meth)acrylate group, and a non-urethane (meth)acrylate monomer means any (meth)acrylate monomer without urethane linkage (—NHCOO—) in the molecule. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the thermosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer preferably has a molecular weight of less than 5,000, more preferably from 100 to 3,000, even more preferably from 200 to 2,000, and most preferably from 300 to 1,500 Dalton.

Any free radical initiator capable of generating free radical in the presence of an infrared absorbing dye or pigment upon exposure to an infrared radiation can be used as the free radical initiator of this invention. Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl)phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl) borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxyethylenoxy)-phen-1-yl]-s-triazine, and s-triazines as described in U.S. Pat. Nos. 5,955,238, 6,037,098, 6,010,824, and 5,629,354); and titanocene (bis($\eta^9$-2,4-cyclopentadien-1-yl) bis[2,6-difluoro-3-(1H-pyrrol-1-yl)phenyl] titanium). Onium salts, borate salts, and s-triazines are preferred thermosensitive free radical initiators. Diaryliodonium salts and triarylsulfonium salts are preferred onium salts. Triarylalkylborate salts are preferred borate salts. Trichloromethyl substituted s-triazines are preferred s-triazines.

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin.

Suitable cationic initiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbers useful in the thermosensitive layer of this invention include any infrared absorbing dye or pigment effectively absorbing an infrared radiation having a wavelength of 700 to 1,500 nm. It is preferable that the dye or pigment having an absorption maximum between the wavelengths of 750 and 1,200 nm. Various infrared absorbing dyes or pigments are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. Examples of useful infrared absorbing pigments include black pigments, metal powder pigments, phthalocyanine pigments, and carbon black. Carbon black is a preferred infrared absorbing pigment. Mixtures of dyes, pigments, or both can also be used. Infrared absorbing dye is preferred over infrared absorbing pigment because the infrared absorbing dye usually has higher absorbing efficiency, gives less visible color, and allows molecular level charge or energy transfer to activate the initiator. The infrared dye or pigment is added in the thermosensitive layer preferably at 0.01 to 30% by weight of the thermosensitive layer, more preferably at 0.1 to 20%, and most preferably at 0.5 to 10%.

While a thermosensitive layer generally comprises an infrared absorbing dye or pigment, the infrared dye moiety may also be incorporated into the molecules of the initiator, monomer, oligomer, or polymer. For example, infrared dye moieties are incorporated into the polymer of a thermosensitive layer for a waterless lithographic plate as described in U.S. Pat. No. 6,132,933. Clearly, this polymer can function as both polymeric binder and infrared absorbing dye.

Polymeric binders useful for the thermosensitive layer of this invention can be any solid film-forming polymers. The polymers may or may not have polymerizable groups or other unsaturated groups (such as (meth)acrylate groups, allyl groups, epoxy groups, or vinyl ether groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, and polyurethane binder. Also useful are aqueous alkaline soluble polymers, such as polymer with sufficient number of carboxylic acid groups or phenol groups to render it soluble in an aqueous alkaline solution, and polymer with (meth)acrylate groups and carboxylate salt groups as described in U.S. Pat. No. 5,849,462. For oleophilic thermosensitive layers, preferred polymeric binders are aqueous alkaline-insoluble polymers. The polymeric binder suitable for the thermosensitive layer of this invention preferably has a weight average molecular weight of at least 5,000, more preferably from 10,000 to 1,000,000, most preferably from 20,000 to 500,000 Dalton.

Various surfactants can be added into the thermosensitive layer to allow or enhance the on-press ink and/or fountain solution developability. Both polymeric and small molecule surfactants can be used. However, it is preferred that the surfactant has low or no volatility so that it will not evaporate from the thermosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g thermosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the thermosensitive layer, more preferably from 0.5 to 20%, and most preferably from 1 to 15%.

A particulate dispersion may be added into the thermosensitive layer to enhance, for example, the developability and non-tackiness of the plate, as described in U.S. Pat. No. 6,071,675, the entire disclosure of which is hereby incorporated by reference.

When an initiator is used as the free acid or free radical initiator in the thermosensitive layer, the initiator can be sensitive to ultraviolet light (or even visible light), or can be only sensitive to light of shorter wavelength, such as lower than 350 nm. Thermosensitive layers containing ultraviolet light (or visible light) sensitive initiator also allow actinic exposure with ultraviolet light (or visible light), but have limited white light stability. Thermosensitive layers containing initiator only sensitive to shorter wavelength (such as shorter than 350 nm) have good white light stability. Each type of initiators has its own advantage, and can be used to design a specific product. In this patent, all types of initiators can be used.

The thermosensitive layer may be conformally coated onto a roughened substrate (for example, with Ra of larger than 0.4 micrometers) at thin coverage (for example, of less than 1.5 g/m$^2$) so that the plate can have microscopic peaks and valleys on the thermosensitive layer coated surface and exhibit low tackiness and good block resistance, as described in U.S. Pat. No. 6,242,156, the entire disclosure of which is hereby incorporated by reference. Here the substrate has a roughened surface comprising peaks and valleys, and the thermosensitive layer is substantially conformally coated on the roughened substrate surface so that the surface of the thermosensitive layer has peaks and valleys substantially corresponding to the major peaks and valleys of the substrate microscopic surface. In a preferred embodiment, the substrate has an average surface roughness Ra of about 0.2 to about 2.0 microns, the thermosensitive layer has an average coverage of about 0.1 to about 2.0 g/m$^2$, and the average height of the valleys on the thermosensitive layer surface is at least 0.1 microns below the average height of the peaks on the thermosensitive layer surface. Such a configuration is especially useful for a plate with a semisolid thermosensitive layer because it allows reduction or elimination of the tackiness and fingerprinting problems.

An ink and/or fountain solution soluble or dispersible overcoat can be deposited on the thermosensitive layer to, for example, protect the thermosensitive layer from oxygen inhibition, contamination, and/or physical damage during handling, reduce tackiness and blocking tendency, and/or improve the on-press developability. For wet plate, the overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Various nonionic surfactants and ionic surfactants can be used. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.01 to 40% by weight of the overcoat, more preferably at 0.2 to 15%. The overcoat preferably has a coverage of from 0.001 to 1 $g/m^2$, more preferably from 0.002 to 0.45 $g/m^2$, and most preferably from 0.005 to 0.20 $g/m^2$.

A thin releasable interlayer soluble or dispersible in ink and/or fountain solution can be deposited between the substrate and the thermosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference. The interlayer is preferably soluble in water. Particularly, a water soluble interlayer can be coated between a roughened aluminum substrate and a thermosensitive layer. The coating weight for the interlayer is preferably from 1 to about 200 $mg/m^2$, more preferably about 4 to about 40 $mg/m^2$; the aluminum substrate is preferably electrochemically grained, anodized, and further treated with a hydrophilic material, and preferably has an Ra of at least 0.2 microns, more preferably from 0.4 to 1.0 microns.

The plate is usually coated on a manufacture line by coating the thermosensitive layer, and optionally the overcoat and/or the interlayer, on the substrate. The coated plate (which is usually cut to suitable sizes) is sold as commercial products to be used in the pressroom for imaging and printing. For direct-to-press applications, alternatively, the plate may be directly coated on the plate cylinder of a lithographic press equipped with digital laser imaging device. The thermosensitive layer can be coated onto the substrate which is a sheet material mounted on the plate cylinder or is the surface of the plate cylinder of the press. A coating device containing the thermosensitive fluid can be mounted on the press. The coating device can coat through any means, such as slot coating, roller coating, spray coating, and inkjet. The coating fluid can be a solvent or aqueous solution or dispersion, or can be free of solvent or water. For coating free of solvent or water, a liquid or semisolid thermosensitive coating material can be used. After coating (and optionally further drying), the thermosensitive layer can be exposed with an infrared laser to imagewise harden the exposed areas. The exposed plate surface can then be contacted with ink and/or fountain solution to remove the non-hardened areas and to print imaging from the plate (usually through a blanket cylinder) to the receiving medium. The plate substrate can be a sheet material mounted on the plate cylinder, or can be the cylinder surface. Press with the cylinder surface as the substrate can be used for seamless printing. For press using the cylinder surface as the substrate or with a reusable plate substrate, after the completion of printing, the hardened thermosensitive layer may be stripped off by various means, including wiping with a cloth dampened with a solvent or solution or stripping with a blade. Such a stripping process may be performed by hand or with a stripping device mounted on the press. The stripped substrate can be re-coated with the thermosensitive layer (and optionally the overcoat and/or interlayer) to form a thermosensitive plate for next imaging and printing application.

The plate is usually supplied as sheets, preferably in a pre-cut size suitable for mounting on the press to be printed with. The plates in sheets are preferably packaged in a light-tight wrapping paper or bag for shipping and storage. The plate taken out of the light-tight package is preferably mounted onto the exposure device (or press, for on-press exposure) within 30 minutes, more preferably within 5 minutes, and most preferably within 2 minutes, in order to avoid prolonged exposure to the room light. Such plates can also be packaged in a cassette, preferably a light-tight cassette, so that the plate can be automatically loaded onto the plate cylinder of the press. Optionally, an interleaf can be placed between plates in the package to, for example, prevent plates from sticking to each other or from damaging to the coating. For interleaved plates stacked in a loading device or cassette for automatic loading, the interleaf on top of the stack is preferably automatically removed before automatically transferring the plate from top of the stack to said exposure device. The interleaf useful in this invention can be any flexible sheet material, such as regular paper, treated paper (for anti-sticking), wax treated paper, silicone treated paper, or plastic foil. The interleaf is preferably a paper, more preferably a treated paper, and most preferably wax or silicone treated paper.

Alternatively, the plate can be supplied as web in a roll, and is cut to a size suitable for mounting on press before imaging. Preferably, the web-form plate in a roll is in a light-tight cartridge to prevent any room light from reaching the plate. The plate in the form of roll can be installed inside the plate cylinders of the press and automatically pulled out from the roll in the cartridge to mount on the plate cylinder for each new printing job. For example, the plate can be pulled out from the original unexposed plate roll in a light-tight cartridge installed inside the plate cylinder to mount onto the external surface of the plate cylinder and then wound onto the used plate roll that is also installed inside the plate cylinder. The plate cylinder design having the plate rolls inside the cylinder is described in U.S. patent application Ser. No. 11/453,522, the entire disclosure of which is hereby incorporated by reference. Optionally, an interleaf can be inserted between the front and back of the web in the roll to, for example, prevent the coating from sticking to the back of the web or from damaging to the coating; for press or imager which automatically mounts the plate from the roll, the interleaf can be automatically removed or rolled up to a different roll; for web-form plate with the web roll stored inside the plate cylinder, the interleaf can be rolled up to a different roll inside the plate cylinder.

For press using the cylinder surface as the substrate or with a reusable plate substrate, the thermosensitive layer (and optionally overcoat and/or interlayer) coating, imagewise exposure with infrared radiation, on-press development with ink and/or fountain solution, printing to the receiving sheet, and stripping can be performed sequentially and continuously around the rotating plate cylinder so that each printed sheet can have different imaging. For such an application, the thermosensitive layer must be able to develop quickly upon contact with the ink and/or fountain solution rollers. Such a process is suitable for variable data printing. When miniaturized, such a system can be used for desktop printing, performing similar function as the current laser Xerox printer and inkjet printer.

The lithographic plate of the present invention can also be used as a seamless sleeve printing plate. In this option the printing plate is soldered in a cylindrical form. This cylindrical printing plate which has a diameter similar to the outer surface of the plate cylinder is slid onto the plate cylinder from one end of the plate cylinder. The seamless sleeve printing plate can be coated with thermosensitive layer (and optionally the overcoat and/or interlayer) before or after sliding onto the plate cylinder of the press.

The infrared radiation suitable for exposing the lithographic plate of the instant invention can be from any infrared radiation source suitable for digital imaging. Infrared lasers are preferred infrared radiation sources. Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 2000 $mJ/cm^2$, more preferably from 5 to 1000 $mJ/cm^2$, most preferably from 30 to 500 $mJ/cm^2$, depending on the sensitivity of the thermosensitive layer.

Laser imaging devices are currently widely available commercially. Any device can be used which provides imagewise laser exposure according to digital imaging information. Commonly used imaging devices include flatbed imager, internal drum imager, and external drum imager. Internal drum imager and external drum imager are preferred imaging devices.

The plate can be imaged off press or on press. For off-press imaging, the plate is imagewise exposed with a laser in a plate imaging device, and the exposed plate is then mounted on the plate cylinder of a lithographic press to be developed with ink and/or fountain solution by rotating the press cylinders and contacting the plate with ink and/or fountain solution and to lithographically print images from said plate to the receiving media (such as paper). For on-press imaging, the plate is exposed while mounted on a lithographic printing press cylinder, and the exposed plate is directly developed on press with ink and/or fountain solution during initial press operation and then prints out regular printed sheets. This is especially suitable for computer-to-press application in which the plate (or plates, for multiple color press) is directly exposed on the plate cylinder of a press according to computer generated digital imaging information and, with minimum or no treatment, directly prints out regular printed sheets. For on-press development, good quality prints should be obtained preferably under 20 initial impressions, and more preferably under 5 impressions.

For the wet press of this invention, the ink and fountain solution may be applied at any combination or sequence, as needed for the plate. For conventional wet press, the fountain solution and the ink are applied to the plate from different rollers (fountain solution roller and ink roller); preferably fountain solution is applied (to contact the plate) first, followed by contacting with ink roller. For press with integrated inking/dampening system, the ink and fountain solution are emulsified by various press rollers before being transferred from the ink roller to the plate as emulsion of ink and fountain solution. The recently introduced single fluid ink that can be used for printing wet lithographic plate without the use of fountain solution, as described in for example U.S. Pat. No. 6,140,392, can also be used for the on-press development and printing of the plate of this invention.

The plate can be applied with a deactivating agent, preferably as an aqueous solution, which is capable of deactivating the hardening capability of the photosensitive layer, after imagewise exposure and before on-press development with ink and/or fountain solution. This will allow the exposed plate to remain developable even after exposure to room light for an extended time. A preferred deactivating agent is an acid or base compound, including organic and inorganic compound, which can quickly react with the initiating system of the thermosensitive layer to make such system insensitive to light. The deactivating agent is preferably dissolved in a solvent and applied to the plate as solution, and more preferably dissolved in water and applied to the plate as aqueous solution. Blend of water and solvent can also be used to dissolve the deactivating agent to form the deactivating solution. Such deactivating agent and method are described in U.S. patent application Ser. No. 11/356,911, the entire disclosure of which is hereby incorporated by reference.

The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution. Preferably, the aqueous solution contains a deactivating agent capable of deactivating the thermosensitive layer, so that the aqueous solution treated plate remains developable even after exposure to office white light for extended time.

A liquid layer may be applied onto the surface of the plate (with or without an overcoat) before and/or during imaging process to provide an in situ oxygen barrier layer during the imaging process to allow faster photospeed and better curing. The liquid layer can be any liquid material that does not cause substantial adverse effect on the plate. Water, fountain solution, and other aqueous solutions are preferred materials for forming the liquid layer for a plate with an oleophilic thermosensitive layer. The liquid layer may be applied from a dampening roller of a lithographic press with the plate being mounted on the plate cylinder during on-press imaging process. The dampening roller can be a regular dampening roller which supplies fountain solution during printing or can be a different roller.

An inert gas (such as nitrogen) may be introduced within the device or near the exposure areas during a laser imaging process to reduce oxygen inhibition of free radical polymerization of the thermosensitive layer. The inert gas may be flushed from a nozzle mounted next to the laser head onto the areas being imaged during the laser imaging process; this is especially useful for external drum imaging devices, including off-press laser imaging devices having an external drum and on-press laser imaging devices utilizing plate cylinder as the imaging drum.

For plate with limited room light stability, the laser exposure and/or the on-press development can be performed with the plate under lighting that contains no or substantially no radiation below a wavelength selected from 400 to 650 nm, or in the dark or substantially dark; preferably under lighting that contains no radiation below a wavelength selected from 400 to 650 nm, or in the dark. Such lighting is usually a yellow or red light. This includes a light that is from a fluorescence or incandescence lamp that is covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. Such lighting can be the room lighting for the pressroom or the lighting in a light-tight (or yellow or red light passing only) box or boxes containing the plate being exposed or on-press developed or containing the exposure device or the plate. Preferably, the plates can be packaged in a light-tight (or yellow or red light passing only) cassette. The cassette can be connected to the laser exposure device with light-tight (or yellow or red light passing only) covers for the plate being exposed. The plate can be automatically transferred to the exposure device for laser exposure. The exposed plate can be transferred to the press for on-press development manually under yellow or red light, or automatically under yellow or red light or in the dark. After the plate has been on-press developed, the lighting is preferably switched to white light (by turning on white light or removing yellow or red light passing only filter) in order to facilitate the viewing of the plate during printing. Such methods are described in U.S. patent application Ser. No. 11/057,663, the entire disclosure of which is hereby incorporated by reference.

The lithographic printing plate of this invention can be exposed with an infrared radiation (preferably infrared laser) and on-press developed on a lithographic press having covers which prevent at least 95%, preferably at least 99%, more preferably at least 99.8%, and most preferably all of the room light or of the portion of the room light having wavelengths below 450 nm from reaching the plate mounted on the plate cylinder. Here the term "prevent at least 95% of the room light from reaching the plate" means the intensity for light coming from outside of the press at each wavelength around the plate cylinder is less than 5% of the intensity of the light at such wavelength around outer top surface of the press under normal office lighting (with light coming from the ceiling lamps). The covers can be non-transparent to light or only transparent to light with wavelength above 450 nm, preferably above 500 nm, most preferably above 550 nm. Preferably, the covers have some areas non-transparent to any room light and some other areas only transparent to yellow or red light. At least the plate mounded on the plate cylinder is in a compartment shielded with the covers. The compartment can cover (i) the plate cylinder, part of the exposure means, and part of the inking means; (ii) the plate cylinder, the exposure means, and part of the inking means; (iii) the plate cylinder, the exposure means, and the inking means; (iv) the plate cylinder, the blanket cylinder, the impression cylinder, the exposure means, the inking means, the medium to be fed, and the printed medium; or (v) the entire press except for certain controlling handles or buttons; as long as the plate mounted on the plate cylinder is shielded from at least 95% of the room light having wavelength of less than 450 nm and all the press moving parts can move as designed. Preferably, the compartment covers the entire press except for certain control buttons. The compartment can be connected to a light-tight cassette containing the plate to be fed or has a light-tight slot for feeding a plate from a light-tight cassette or bag or covered with a non-transparent cover sheet, or the plate can be mounted onto the plate cylinder from a roll of fresh plate in a light-tight cartridge stored inside the plate cylinder. Preferably, the plate is automatically mounted onto the plate cylinder from a roll of fresh plate in the form of continuous web in a light-tight cartridge stored inside the plate cylinder. The press designs and methods as described in U.S. patent application Ser. No. 11/453,522, the entire disclosure of which is hereby incorporated by reference, can be adapted for the instant invention by installing an infrared laser to replace other laser.

This invention is further illustrated by the following non-limiting examples of its practice. Unless specified, all the values are by weight.

Example 1

An electrochemically grained, anodized and polyvinylphosphonic acid treated aluminum substrate was first coated with a 0.2% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with a thermosensitive layer formulation PS-1 with a #8 Meyer rod, followed by drying in an oven at 90° C. for 2 min.

| PS-1 | |
| --- | --- |
| Component | Weight (g) |
| Neocryl B-728 (Polymer from Zeneca) | 2.50 |
| Ebecryl 220 (Acrylate monomer from UCB Chemicals) | 5.99 |
| Pluronic L43 (Nonionic surfactant from BASF) | 0.40 |
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-1 using a #6 Meyer rod, followed by hot air blow drying and baking in an oven at 90° C. for 2 min.

| OC-1 | |
| --- | --- |
| Component | Weight ratios |
| Airvol 203 (Polyvinyl alcohol from Air Products) | 5.0 |
| Triton X-100 (Surfactant from Union Carbide) | 0.12 |
| Silwet 7604 (Surfactant from Union Carbide) | 0.02 |
| Water | 95.0 |

The coated plate was exposed with an infrared laser imager equipped with laser diodes emitting at about 830 nm (Trendsetter from Creo) at a dosage of about 200 mJ/cm$^2$. The exposed plate was directly mounted on the plate cylinder of a lithographic press (AB Dick 360, with integrated inking system) for on-press development. After starting the press (rotating essentially all cylinders and rollers), the fountain solution roller was engaged with the ink roller for 20 rotations (of the plate cylinder), and the ink roller (carrying emulsion of ink and fountain solution) was further engaged with the plate cylinder for 20 rotations (of the plate cylinder). The plate cylinder was then engaged with the blanket cylinder and printed with paper. The printed sheets showed good inking, clean background, and 2-98% resolution under 10 impressions. The plate continued to run for a total of 1000 impressions without showing any wearing (The press stopped at 1000 impressions.).

Example 2

An electrochemically grained, anodized and silicate treated aluminum sheet was coated with thermosensitive layer formulation PS-2 using a #6 Meyer rod, followed by drying in an oven at 90° C. for 2 min.

| PS-2 | |
| --- | --- |
| Component | Weight ratios |
| Neocryl B-728 (Polymer from Zeneca) | 2.73 |
| Sartomer SR-399 (Acrylic monomer from Sartomer) | 6.52 |

-continued

PS-2

| Component | Weight ratios |
|---|---|
| Pluronic L43 (Nonionic surfactant from BASF) | 0.56 |
| 2,4-Bis(trichloromethyl)-6-[(4-ethoxyethylenoxy)-phen-1-yl]-s-triazine | 1.00 |
| ADS-830AT (Infrared absorbing cyanine dye from American Dye Source) | 0.10 |
| Acetone | 90.0 |

The thermosensitive layer coated plate was further coated with a water-soluble overcoat OC-2 using a #6 Meyer rod, followed by drying in an oven at 100° C. for 2 min.

OC-2

| Component | Weight ratios |
|---|---|
| Airvol 205 (Polyvinyl alcohol from Air Products) | 5.00 |
| Zonyl FSO (Perfluorinated surfactant from DuPont) | 0.02 |
| Water | 95.00 |

The coated plate was exposed with an infrared laser plate imager equipped with laser diodes emitting at about 830 nm (Trendsetter from Creo) at a dosage of about 300 mJ/cm². The exposed plate was tested on a wet lithographic press (Multigraphics 1250) equipped with conventional inking and dampening systems. The exposed plate was directly mounted on the plate cylinder of the press. After starting the press, the plate cylinder was engaged with the fountain solution roller for 20 rotations and then further engaged with the ink roller for 20 rotations. The plate cylinder was then engaged with the blanket cylinder and printed with paper. The printed sheets showed clean background, good inking, and 2-98% resolution under 5 impressions. The press continued to run for a total of 1000 impressions without showing any wearing (The press stopped at 1000 impressions.).

I claim:

1. A method of developing a lithographic printing plate, comprising in order:
    (a) providing on a lithographic press a lithographic printing plate comprising (i) a substrate; and (ii) a thermosensitive layer soluble or dispersible in ink and/or fountain solution and capable of hardening upon exposure to an infrared laser; wherein said thermosensitive layer exhibits an affinity or aversion substantially opposite to the affinity or aversion of said substrate to at least one printing liquid selected from the group consisting of ink and an abhesive fluid for ink;
    (b) imagewise exposing said plate with said infrared laser to cause hardening of said thermosensitive layer in the exposed areas; and
    (c) developing said exposed plate with ink and/or fountain solution on a lithographic press to remove the thermosensitive layer in the non-hardened areas;
    (d) wherein said press is shielded with covers that prevent at least 95% of the room light from reaching the plate mounted on the plate cylinder.

2. The method of claim 1 wherein said plate is supplied in the form of sheet or sheets, and is mounted onto the plate cylinder of said press manually or automatically.

3. The method of claim 1 wherein said plate is supplied in the form of sheets packaged in a light-tight cassette and is transferred from said cassette to mount onto the plate cylinder of said press.

4. The method of claim 1 wherein said plate is supplied in the form of continuous web in a roll mounted inside the plate cylinder of said press, and a portion of the web is pulled out from the roll and mounted onto die plate cylinder of said press for the imagewise exposure and on-press development.

5. The method of claim 4 wherein said roll has an interleaf between the front and back of the web, and the unwound portion of the interleaf is removed or rolled up to a roll of interleaf inside the plate cylinder.

6. The method of claim 1 wherein said plate is supplied in the form of continuous web with one end roiled out from a fresh roll of plate in a light-tight cartridge and the other end rolled into a used roll in a second cartridge, both cartridges are installed within the plate cylinder with the portion of the plate between the cartridges being mounted on the plate cylinder, and said plate is unwound from the light-tight cartridge and wound into the second cartridge in order to mount a fresh portion to replace a used portion of the plate on the plate cylinder at the beginning of a new printing operation.

7. The method of claim 1 wherein said thermosensitive layer comprises a polymeric binder, a polymerizable monomer, an initiator, and an infrared absorbing dye.

8. The method of claim 1 wherein said substrate is hydrophilic, and said thermosensitive layer is oleophilic.

9. The method of claim 1 wherein said plate further includes an ink and/or fountain solution soluble or dispersible overcoat on the thermosensitive layer.

* * * * *